United States Patent [19]

Fleurial et al.

[11] Patent Number: 5,831,286
[45] Date of Patent: *Nov. 3, 1998

[54] HIGH MOBILITY P-TYPE TRANSITION METAL TRI-ANTIMONIDE AND RELATED SKUTTERUDITE COMPOUNDS AND ALLOYS FOR POWER SEMICONDUCTING DEVICES

[75] Inventors: Jean-Pierre Fleurial, Duarte, France; Thierry Caillat, Pasadena, Calif.; Alexander Borshchevsky, Santa Monica, Calif.; Jan W. Vandersande, Upland, Calif.

[73] Assignee: California Institute of Technology, Pasadena, Calif.

[*] Notice: The term of this patent shall not extend beyond the expiration date of Pat. No. 5,610,366.

[21] Appl. No.: 643,914

[22] Filed: May 7, 1996

Related U.S. Application Data

[60] Provisional application No. 60/000,600 Jun. 30, 1995.

[51] Int. Cl.[6] ................................................ H01L 31/0256
[52] U.S. Cl. .................... 257/76; 257/613; 252/62.3 T
[58] Field of Search ........................ 257/76, 613, 614, 257/615; 136/202, 236.1, 240, 238, 205; 252/62.3 T

[56] References Cited

U.S. PATENT DOCUMENTS 5,610,366  3/1997  Fleurial et al. ........................ 136/202

Primary Examiner—Sara W. Crane
Attorney, Agent, or Firm—Michaelson & Wallace

[57] ABSTRACT

Transition metals (T) of Group VIII (Co, Rh and Ir) have been prepared as semiconductor alloys with Sb, P, and As, having the general formula TX, wherein X is $Sb_3$, $P_3$, or $As_3$. The skutterudite-type crystal lattice structure of these semiconductor alloys and their enhanced semiconductor properties results in semiconductor materials which may be used in the fabrication of power semiconductor devices to substantially improve the efficiency of the resulting semiconductor device. Semiconductor alloys having the desired skutterudite-type crystal lattice structure may be prepared in accordance with the present invention by using vertical gradient freeze techniques, liquid-solid phase sintering techniques, low temperature powder sintering and/or hot-pressing.

27 Claims, 6 Drawing Sheets

HIGH MOBILITY P-TYPE TRANSITION METAL TRI-ANTIMONIDE AND RELATED SKUTTERUDITE COMPOUNDS AND ALLOYS FOR POWER SEMICONDUCTING DEVICES

BACKGROUND OF THE INVENTION

1. Origin of the Invention

The invention described herein was made in the performance of work under a NASA contract, and is subject to the provisions of Public Law 96-517 (35 U.S.C. § 202) in which the Contractor has elected to retain title.

2. Field of the Invention

The present invention relates, in general, to new compounds for semiconductor devices, and in particular, to high mobility transition metal tri-antimonides and related skutterudite compounds and alloys for power semiconducting devices.

3. Related Art

A power semiconductor device is an integrated circuit organized as an assembly of interconnected electrode components contained within a semiconductor chip. The fabrication of the integrated circuit is a precise and complicated process. A series of production steps such as etching, heating, and diffusion of impurities into the semiconductor material is performed to produce various regions of individual transistors, diodes, and resistors. The components of the integrated circuit in the semiconductor device are produced by doping the silicon during a diffusing process which can utilize phosphorus to create N-type material, and boron to create P-type material. The particular arrangement of the N-type and P-type regions in the silicon define the particular circuit or component that is to be created.

The operating characteristics of power semiconductor devices include low powered dissipation, low voltage requirements, and smaller size. Power semiconductor devices have extremely low input resistance, and thus, produce no loading effect while requiring fewer components. In addition, power semiconductor devices produce less electrical noise, use less power, and require less cooling. Therefore, power semiconductor devices are used in high frequency, high temperature and high efficiency applications.

However, power semiconductor devices utilizing currently available semiconductor materials, such as silicon, are rapidly approaching their theoretical limits of performance. For example, silicon semiconductors lose power at high frequencies, cannot operate at high temperatures, and cannot operate at high power levels and, thus, cannot achieve higher efficiencies. Consequently, other semiconducting materials are needed for applications that require semiconductors to operate at high frequencies, high temperatures and high power levels to thereby achieve higher efficiencies.

Semiconducting materials that have excellent transport properties, such as high carrier mobility, relatively wide bandgaps and high saturated electron velocity at high electric fields are needed. GaAs (Gallium Arsenide), βSiC (Silicon Carbide) and diamond are the most recent semiconducting compounds tested for high temperature, high power and high speed electronic devices. However, these compounds have numerous technological difficulties and manufacturing problems and are not currently feasible.

Therefore what is needed are semiconductor compounds for fabricating power semiconductor devices that allow the operation of semiconductor devices at higher frequencies, higher temperatures and higher power levels to thereby achieve higher efficiencies.

Whatever the merits of the above mentioned devices and methods, they do not achieve the benefits of the present invention.

SUMMARY OF THE INVENTION

To overcome the limitations in the prior art described above, and to overcome other limitations that will become apparent upon reading and understanding the present specification, the present invention employs high mobility metal tri-antimonides and related skutterudite compounds and alloys for power semiconducting devices.

In accordance with the present invention, disadvantages and problems associated with previous designs and preparations of materials used in the fabrication of power semiconductor devices have been substantially reduced or eliminated. The present invention provides the ability to operate semiconductor devices at high frequencies, high temperatures and high power levels to thereby achieve higher efficiencies.

Materials of the present invention with a skutterudite-type crystal lattice structure and desired semiconductor properties are used in the fabrication of the semiconductor devices. Examples of skutterudite materials and alloys of the present invention include, but are not limited to, a family of P-type binary compounds formed with the formula $AB_3$, wherein A is Co, Rh or Ir, and B is Sb, P, or As. Specifically, compounds $CoSb_3$, $RhSb_3$, $IrSb_3$, $CoP_3$, $RhP_3$, $IrP_3$, $CoAs_3$, $RhAs_3$, $IrAs_3$ or $Co_{1-x-y}Rh_xIr_ySb_3$, $Co_{1-x-y}Rh_xIr_yP_3$, and $C_{1-x-y}Rh_xIr_yAs_3$ respectively, wherein $0 \leq x \leq 1$ and $0 \leq y \leq 1$ and related alloys can be used.

In accordance with one aspect of the present invention, P-type semiconductor materials are formed from alloys $CoSb_3$, $RhSb_3$, $IrSb_3$, $CoP_3$, $RhP_3$, $IrP_3$, $CoAs_3$, $RhAs_3$, and $IrAs_3$ or $Co_{1-x-y}Rh_xIr_ySb_3$, $Co_{1-x-y}Rh_xIr_yP_3$, and $Co_{1-x-y}Rh_xIr_yAs_3$ for use in fabricating power semiconductor devices with substantially enhanced operating characteristics and improved efficiency as compared to previous semiconductor devices.

In accordance with another aspect of the present invention, N-type semiconductor materials are formed from alloys $CoSb_3$, $RhSb_3$, $IrSb_3$, $CoP_3$, $RhP_3$, $IrP_3$, $CoAs_3$, $RhAs_3$, and $IrAs_3$ or $Co_{1-x-y}Rh_xIr_ySb_3$, $Co_{1-x-y}Rh_xIr_yP_3$, and $Co_{1-x-y}Rh_xIr_yAs_3$ for use in fabricating power semiconductor devices with substantially enhanced operating characteristics and improved efficiency as compared to previous semiconductor devices.

An important technical advantage of the present invention includes the use of gradient freeze techniques in the preparation of semiconductor materials such as $CoSb_3$, $RhSb_3$, $IrSb_3$, $CoP_3$, $RhP_3$, $IrP_3$, $CoAs_3$, $RhAs_3$, and $IrAs_3$. The use of gradient freeze techniques in accordance with the present invention produces a large, single crystal of semiconductor alloys having a skutterudite lattice structure. A Bridgman Two-Zone furnace and a sealed container have been modified for use in preparation of semiconductor materials in accordance with the present invention.

Another important technical advantage of the present invention is the use of liquid-solid phase sintering techniques in the preparation of semiconductor materials such as $CoSb_3$, $RhSb_3$, $IrSb_3$, $CoP_3$, $RhP_3$, $IrP_3$, $CoAs_3$, $RhAs_3$, $IrAs_3$ and $Co_{1-x-y}Rh_xIr_ySb_3$, $Co_{1-x-y}Rh_xIr_yP_3$, and $Co_{1-x-y}Rh_xIr_yAs_3$. The use of liquid-solid phase sintering techniques in accordance with the present invention produces large, polycrystalline ingots of semiconductor alloys having a skutterudite lattice structure. An isothermal furnace and a sealed container have been modified for use in preparation of semiconductor alloys in accordance with the present invention.

A further important technical advantage of the present invention includes the use of low temperature powder sintering and/or hot pressing in the preparation of semiconductor alloys such as $CoSb_3$, $RhSb_3$, $IrSb_3$, $CoP_3$, $RhP_3$, $IrP_3$, $CoAs_3$, $RhAs_3$, $IrAs_3$ and $Co_{1-x-y}Rh_xIr_ySb_3$, $Co_{1-x-y}Rh_xIr_yP_3$, and $Co_{1-x-y}Rh_xIr_yAs_3$. The use of powder sintering and/or hot pressing in accordance with the present invention produces large polycrystalline pellets of semiconductor alloys having a skutterudite lattice structure.

Another aspect of the present invention includes fabricating P-type and N-type semiconductor devices formed from materials such as $CoSb_3$, $RhSb_3$, $IrSb_3$, $CoP_3$, $RhP_3$, $IrP_3$, $CoAs_3$, $RhAs_3$, $IrAs_3$ and $Co_{1-x-y}Rh_xIr_ySb_3$, $Co_{1-x-y}Rh_xIr_yP_3$, and $Co_{1-x-y}Rh_xIr_yAs_3$.

Moreover, similar to group III–V compounds, the composition of the semiconductor alloys of the present invention can be adjusted to fit the specific needs of thin film electronic devices (bandgap) and to match a particular substrate (lattice parameter).

The present invention allows the P-type materials to possess high drift conductance values thereby enabling power-handling capabilities exceeding those of conventional semiconductor materials as well as the characteristics of diamond. Thus, the present invention allows the fabrication of power semiconductor devices such as power field effect transistors (FETS, MOSFETS, MESFETS, and JFETS), schottky diodes, as well as other semiconductor devices associated with high frequencies, high temperatures and high power levels to thereby achieve higher efficiencies. Also, the present invention can be used in other electronic devices where heavily doped materials are needed, such as tunnel diodes and lasers.

Another feature of the present invention is that substantially lower hole carrier concentrations can be achieved for the N-type semiconductor materials. Thus, the present invention can be used as N-type semiconductor materials in devices that require lightly doped electronic materials, such as P-N diffused junctions and heterojunction devices.

Another advantage of the present invention is that the new compounds are relatively easy to prepare. Another advantage is that some of the new compounds are reasonably inexpensive.

Therefore, by using semiconductor alloys such as $CoSb_3$, $RhSb_3$, $IrSb_3$, $CoP_3$, $RhP_3$, $IrP_3$, $CoAs_3$, $RhAs_3$, $IrAs_3$ and $Co_{1-x-y}Rh_xIr_ySb_3$, $Co_{1-x-y}Rh_xIr_yP_3$, and $Co_{1-x-y}Rh_xIr_yAs_3$ and related alloys, which have been prepared in accordance with the present invention, higher frequencies, higher temperatures and higher power levels are achieved to thereby enhance certain devices and increase the overall efficiency of certain semiconductor devices.

BRIEF DESCRIPTION OF THE DRAWINGS

For a more complete understanding of the present invention and its advantages, reference is now made to the following description taken in conjunction with the accompanying drawings in which.

DETAILED DESCRIPTION OF THE PREFERRED EMBODIMENT

U.S. Pat. No. 5,610,366 entitled "HIGH PERFORMANCE THERMOELECTRIC MATERIALS AND METHODS OF PREPARATION", issued on Mar. 11, 1997 by Fleurial et al., is herein incorporated by reference.

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Figure 1:
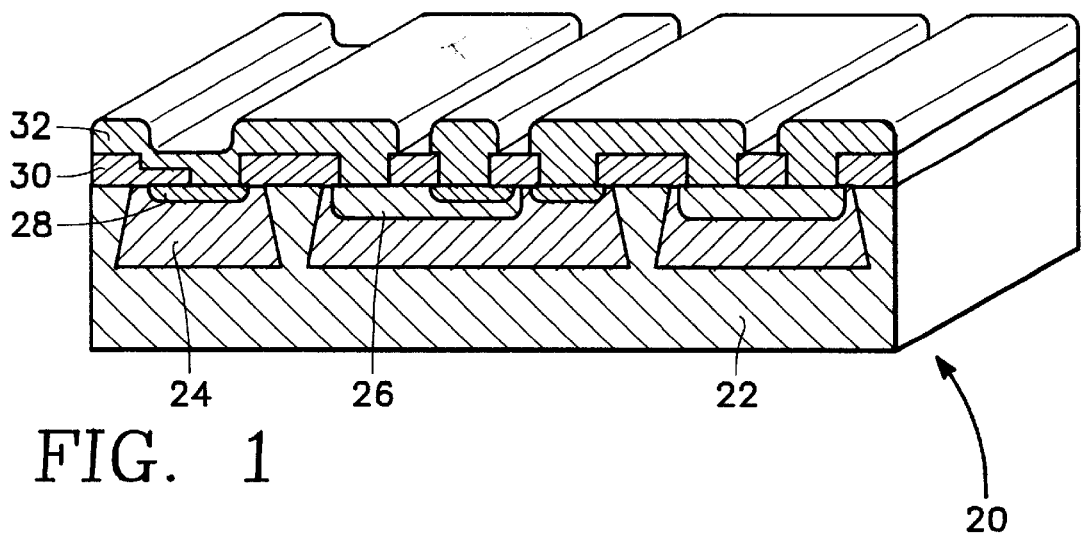
FIG. 1 is a sectional view of a semiconductor device which may be fabricated in accordance with the present invention.

FIG. 1 is a sectional view of a semiconductor device 20 which may be fabricated from semiconductor materials and alloys prepared in accordance with the present invention. The use of such semiconductor materials and alloys for semiconductor devices allows the ability to operate the devices at high frequencies, high temperatures and high power levels to thereby achieve higher efficiencies.

A common property of semiconductor materials is that electricity can be conducted by two type of carriers: electrons in N-type materials and holes in P-type materials. In a crystal, when one atom is replaced by another atom with more valence electrons, the extra electrons are not needed for bonding and are free to move throughout the crystal. This type of electrical conduction is called N-type. However, when an atom is replaced by another atom with fewer electrons, a bond is left vacant and this shortage is referred to as a hole. This type of electrical conduction is called P-type. The extra electrons in the N-type semiconductor materials and the extra holes in the P-type semiconductor materials are frequently referred to as "charge carriers."

Semiconductor device 20 includes a P-type semiconductor alloy 22 of the present invention selectively doped with dopants to form N-type regions 24. The N-type regions 24 can be doped with dopants to define P-type regions 26 within the N-type regions 24. Also N+ (very high N dopant concentration) regions 28 can be formed within both the N-type regions 24 as well as the P-type regions 26. An oxidized 30 film exists above the semiconductor alloy 22. Metal interconnects 32 interconnect the various regions of the semiconductor device 20 to other components to thereby define integrated circuits.

Various regions of semiconductor device 20, can be fabricated from semiconductor alloys $CoSb_3$, $RhSb_3$, $IrSb_3$, $CoP_3$, $RhP_3$, $IrP_3$, $CoAs_3$, $RhAs_3$, $IrAs_3$, as well as $Co_{1-x-y}Rh_xIr_ySb_3$, $Co_{1-x-y}Rh_xIr_yP_3$, and $Co_{1-x-y}Rh_xIr_yAs_3$, wherein $0 \leq x \leq 1$ and $0 \leq y \leq 1$, of the present invention.

Figure 2:
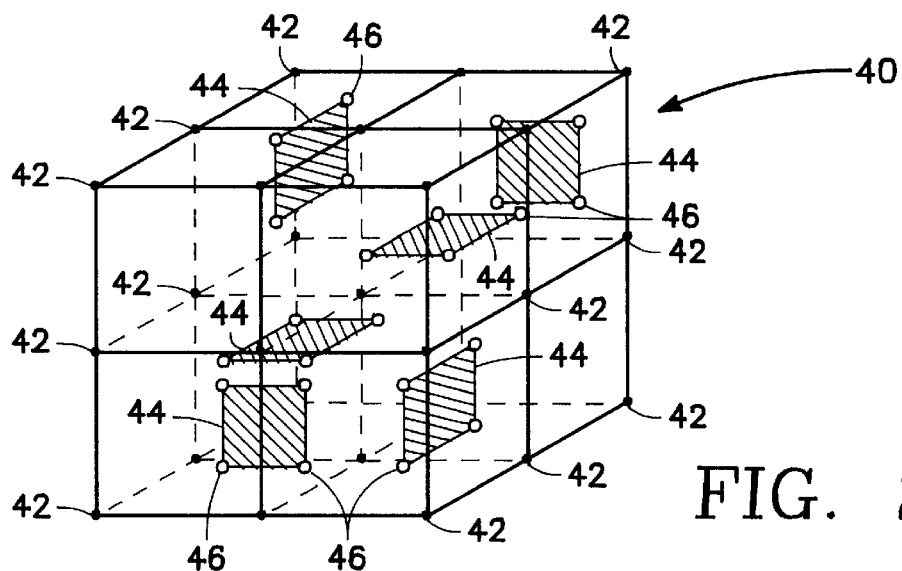
FIG. 2 is an isometric representation of a skutterudite-type crystal lattice structure associated with semiconductor alloys which have been fabricated in accordance with the present invention.

FIG. 2 is an isometric representation of skutterudite semiconductor alloys which can be $CoSb_3$, $RhSb_3$, $IrSb_3$, $CoP_3$, $RhP_3$, $IrP_3$, $CoAs_3$, $RhAs_3$, $IrAs_3$. These semiconductor alloys have been prepared in accordance with the present invention in the form of large, single crystals and polycrystalline ingots with skutterudite crystal lattice structure 40. A typical skutterudite crystal lattice structure is defined in part by a unit cell with eight members having the formula $AB_3$, wherein A may be selected from the group consisting of Co, Rh and Ir, and B may be Sb, P or Ar. Alloys of these elements having the formula $Co_{1-x-y}Rh_xIr_ySb_3$, $Co_{1-x-y}Rh_xIr_yP_3$, and $Co_{1-x-y}Rh_xIr_yAs_3$, wherein $0 \leq x \leq 1$ and $0 \leq y \leq 1$, have also been prepared using the present invention.

Skutterudite-type crystal lattice structure 40 includes a cubic lattice of metal atoms 42. Metal atoms 42 are preferably selected from the group consisting of cobalt, iridium, and/or rhodium. A four-member plenary ring 44 of non-metal atoms 46 is disposed within the cubic lattice structure. Each plenary ring 44 preferably includes four atoms of antimony. Each metal atom 42 has six neighbor atoms 42. Non-metal atoms 46 have two adjacent non-metal atoms 46 and two metal atoms 42. The covalent bonding associated with skutterudite-type crystal lattice structure 40 provides high hole mobility. The complex structure and heavy atoms associated with skutterudite-type crystals also result in low thermal conductivity.

Semiconductor materials having skutterudite-type crystal lattice structure 40 may be doped with selected impurities to produce N-type semiconductor devices 24 and P-type semiconductor devices 26. By optimizing the doping level, $IrSb_3$, $IrP_3$, and $IrAs_3$ semiconductor alloys may be used to produce P-type semiconductor devices for high frequency, high temperature and high efficiency operation. If desired, semiconductor device 20 may be manufactured with P-type semiconductor elements 26 fabricated from $IrSb_3$ $IrP_3$, and $IrAs_3$ and N-type semiconductor elements 24 fabricated from previously available semiconductor materials such as Bi-Sb alloys, $Bi_2Te_3$ based alloys, PbTe based alloys, $\beta$-$FeSi_2$ based alloys, $Ga_{1-x}In_xSb$ based alloys, and SiGe alloys.

Figure 3:
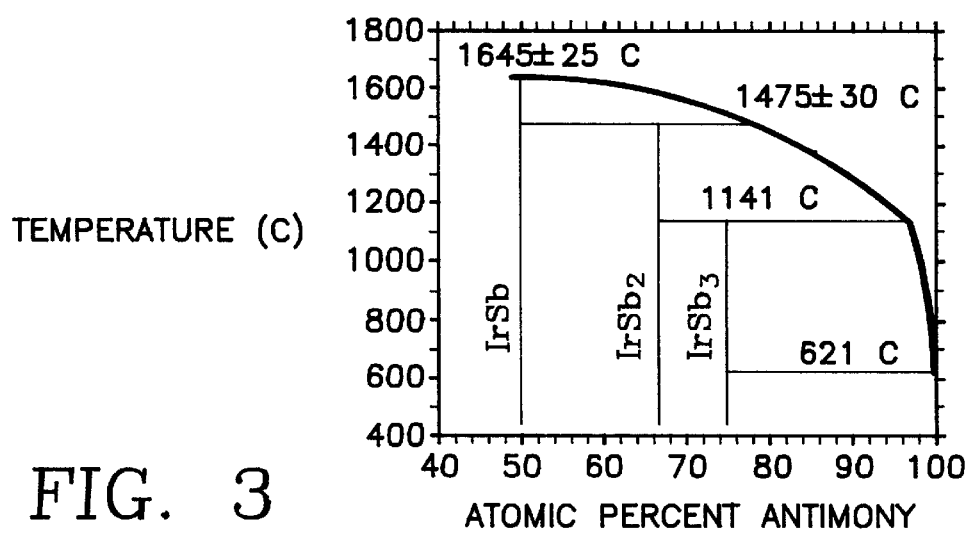
FIG. 3 is an iridium antimony phase diagram.

Large, single crystals of semiconductor alloys have been prepared in accordance with the present invention using gradient freeze techniques. Liquid-solid phase sintering techniques have been used to prepare large, polycrystalline ingots of semiconductor alloys in accordance with the present invention. The phase diagram for iridium-antimony, as shown in FIG. 3 demonstrates that $IrSb_3$ with the desired skutterudite-type crystal lattice structure is very difficult to obtain. Crystal growth is preferably initiated from a narrow range of compositions. In addition, the liquidus curve in antimony rich region forming $IrSb_3$ is relatively sharp which further increases the difficulty of separating liquid and solid phases during crystallization.

Depending upon the desired composition of the semiconductor materials, either gradient freeze techniques, liquid-solid phase sintering techniques, and low temperature powder sintering with or without hot pressing may be used to produce semiconductor alloys with the desired skutterudite-type crystal lattice structure.

For some semiconductor materials such as $CoSb_3$, $RhSb_3$, and $Co_{1-x-y}Rh_xIr_ySb_3$, gradient freeze techniques produce the desired large, single crystal. Crystal growth by gradient freeze techniques is preferably initiated from non-stoichiometric (antimony rich) melts based on the liquid-solid phase diagram associated with the elements which will comprise the resulting semiconductor materials.

For other semiconductor materials, such as single phase semiconductor alloys of the present invention, liquid-solid phase sintering techniques produce the desired large, polycrystalline ingots. Semiconductor alloys such as $IrSb_3$, and $Co_{1-x-y}Rh_xIr_ySb_3$, have been produced using low temperature powder sintering and/or hot pressing. Liquid-solid phase sintering, low temperature powder sintering, and hot pressing are preferably conducted in an isothermal furnace starting from an elemental mixture ($TSb_3$) of the desired elements close to stoichiometry ($\pm 2$ atomic %).

Liquid-solid phase sintering may be satisfactorily performed with powders of Co, Rh, Ir, and shots of corresponding materials. Low temperature powder sintering process is preferably initiated with powders of Co, Ir, and Sb. For some applications, powders of $IrSb_3$ and $Co_{1-x-y}Rh_xIr_ySb_3$ may also be synthesized into large polycrystalline pellets. Hot pressing may be included as part of the low temperature provider entering process.

Figure 4B:
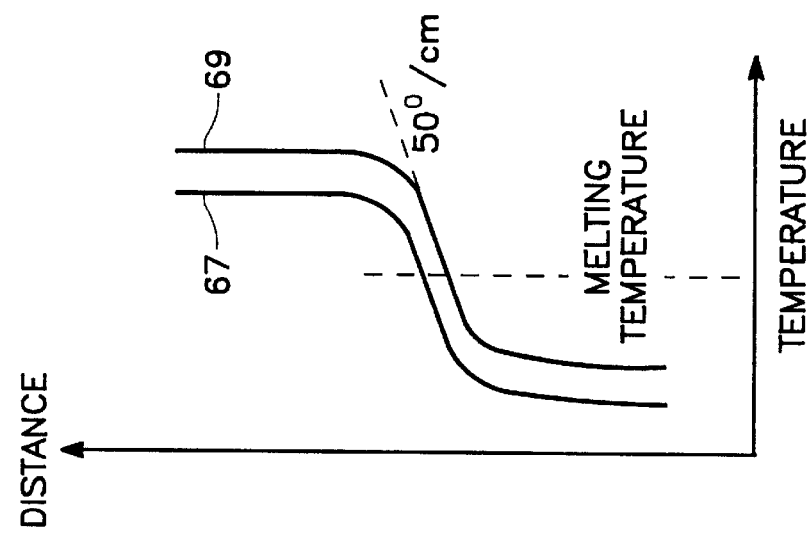
FIG. 4b is a graph showing the temperature gradient in the furnace of FIG. 4a associated with growing large, single crystals of semiconductor alloys having a skutterudite lattice structure in accordance with the present invention.
Figure 4A:
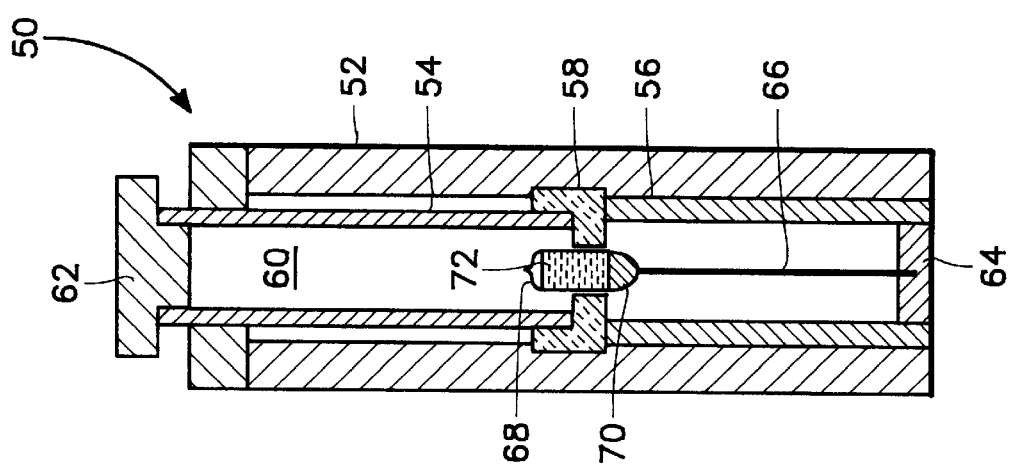
FIG. 4a is a schematic drawing in elevation and in section with portions broken away showing a Bridgman Two-Zone furnace which may be used to prepare semiconductor alloys using gradient freeze techniques in accordance with the present invention.

Large, single crystals of semiconductor alloys with the desired skutterudite lattice structure 40 may be grown by using gradient freeze techniques and furnace 50 as shown in FIG. 4a. Furnace 50, frequently referred to as a Bridgman Two-Zone furnace, includes housing 52 with a first or upper heater assembly 54 and a second or lower heater assembly 56. Housing 52 defines in part chamber 60. Thermal baffle 58 is preferably disposed between first heater assembly 54 and second heater assembly 56 intermediate chamber 60. The various components which comprise furnace 50 are preferably disposed vertically within chamber 60 of housing 52.

As shown in FIG. 4a, housing 52 includes end closure 62 which seals the upper portion of chamber 60 and end closure 64 which seals the lower portion of chamber 60. Quartz rod 66 may be vertically disposed within chamber 60. Container 68 is preferably secured to one end of rod 66 adjacent to thermal baffle 58.

The lower portion 70 of container 68 is preferably pointed or tapered with respect to rod 66. Various types of containers 68 may be satisfactorily used with the present invention. A sealed quartz ampoule has been found satisfactory for use with furnace 50. If desired, housing 52 and end closure 64 may be modified to allow a conveyor (not shown) with a plurality of rods 66 and containers 68 to pass sequentially through furnace 50.

Elements such as Co, Rh, and Sb, powders which will form the desired semiconductor alloy using furnace 50, are preferably sealed within container 68 under a vacuum. Pointed or tapered end 70 of container 68 is attached to quartz rod 66 and disposed vertically within chamber 60. Tapered end 70 and its attachment to rod 66 cooperate to maintain the desired temperature gradients in container 68. Furnace 50 is then heated to establish the desired temperature gradient 69 and controlled cooling 67 as shown in FIG. 4b. Various temperature gradients may be used depending upon the elements placed within container 68 to produce the desired semiconductor alloy.

For one embodiment of the present invention samples of $CoSb_3$ and $RhSb_3$ were directionally crystallized from non-stoichiometric melt 72 rich in antimony. Crystals of $CoSb_3$ and $RhSb_3$ were grown with an axial temperature gradient of about 500/degrees C./cm and a growth rate about 1 mm/day. The crystals of $CoSb_3$ and $RhSb_3$ were approximately 10 mm long and 6 mm in diameter. The average density of the $CoSb_3$ crystals was measured and found to be 99.7% of the theoretical density (7.69 $g/cm^3$). The average density of the $RhSb_3$ crystals was measured and found to be 99.5% of the theoretical density (7.96 $g/cm^3$). Crystals of the $Ir_xCo_{1-x}Sb_3$ solid solutions were also successfully grown by gradient freeze techniques from antimony-rich melts in furnace 50. The samples produced had good semiconducting properties including exceptional P-type Hall mobilities as high as 8000 $cm^2/Vs$ at room temperature.

Figure 5:
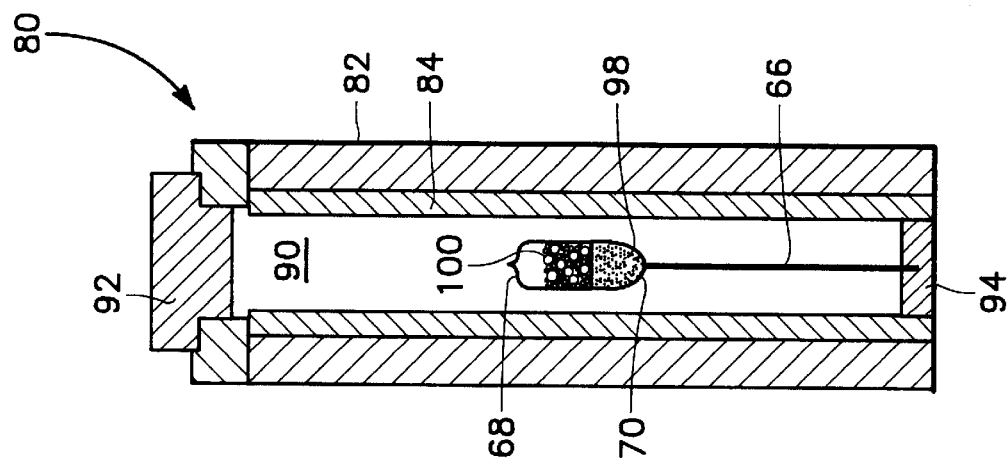
FIG. 5 is a schematic drawing in elevation and in section with portions broken away showing an isothermal furnace which may be used during liquid solid phase sintering to prepare large polycrystalline ingots of semiconductor alloys having a skutterudite lattice structure in accordance with the present invention.

Large polycrystalline ingots of semiconductor materials with a skutterudite lattice structure may also be prepared by using liquid-solid phase sintering techniques and furnace 80 as shown in FIG. 5. Furnace 80 may be referred to as an isothermal furnace as compared to furnace 50 which has two different temperature zones. Furnace 80 includes housing 82 with heater assembly 84 disposed therein. Housing 82 defines in part chamber 90. Various components which comprise furnace 80 are preferably vertically disposed within chamber 90 of housing 82.

As shown in FIG. 5, housing 82 includes end closure 92 which seals the upper portion of chamber 90 and end closure 94 which seals the lower portion of chamber 90. Quartz rod 66 is preferably disposed vertically within chamber 90. Container 68 is preferably secured within chamber 90 intermediate end closures 94 and 92 at approximately the midpoint of chamber 90. For one embodiment of the present invention vibrating rod 66 improved the yield of the sintering technique.

The semiconductor materials may be sealed within container 68. The lower portion 70 of container 68 may be pointed or tapered with respect to quartz rod 66. For some applications, container 68 may have a relatively flat lower portion 70. The relationship of lower portion 70 with quartz rod 66 cooperate to maintain the desired temperature in container 68 during preparation of the skutterudite-type crystal structure 40. Various types of containers 68 may be satisfactorily used with the present invention. A sealed quartz crystal or crystal ampoule has been found satisfactory for use with the present invention. As previously noted for furnace 50, housing 82 and end closure 94 may be modified to allow a conveyor (not shown) to pass a plurality of rods 66 and containers 68 sequentially through furnace 80.

For example, liquid-solid phase sintering techniques have been used to prepare large, polycrystalline ingots of semi-conductor material $IrSb_3$ and also some alloys of $(Ir_{1-x-y}Rh_xCo_y)Sb_3$ solid solutions using furnace 80 and container 68. The ingots were approximately 10 mm long and 6 mm in diameter.

The liquid-solid phase sintering technique used to produce $IrSb_3$ and $(Ir_{1-x-y}Rh_xCo_y)Sb_3$ solid solutions, for example, included placing a first layer 98 of elemental iridium, cobalt and/or rhodium powders together with a second layer 100 of antimony shots in container 68 sealed under vacuum. In the case of the preparation of a solid solution $(Ir_{1-x-y}Rh_xCo_y)Sb_3$, the powders of iridium, cobalt and rhodium in the desired ratio were loaded in plastic vials, mixed and shaken in a mixer mill (not shown) for about thirty minutes. Container 68 with material layers 98 and 100 was then positioned vertically and heated in furnace 80 as illustrated in FIG. 5. Several different reaction times and temperatures were tried. For some mixtures, the best results were obtained with a reaction time of 24 hours at a temperature of 1000C. Under these conditions, the resulting ingots were the most dense.

Transport properties measurements performed on samples of the semiconductor alloys of the present invention prepared using the previously described procedures and apparatus demonstrated excellent semiconducting properties. For example, the alloys with skutterudite-type crystal lattice structure 40 had exceptional high P-type Hall mobilities. Room temperature Hall mobility values as high as 7725 $cm^2/Vs$ were measured on a $RhSb_3$ sample at a doping level of $2.4 \cdot 10^{18} cm^{-3}$.

Although linked to the particular crystal structure of this alloy, this high value is also a result of the good quality of the sample. For example, lower mobilities were measured on hot-pressed $RhSb_3$ samples, such as a maximum value of 1500 $cm^2/Vs$. Mobility as high as 1794 $cm^2/Vs$ were measured on P-type $CoSb_3$ single crystals, at a doping level of $5.0 \cdot 10^{18} cm^{-3}$, compared to a maximum value of 290 $cm^2/Vs$ for samples prepared by other procedures. In addition, $IrSb_3$ samples possessed high P-type Hall mobilities, for instance, as high as 1352 $cm^2/Vs$ at a doping level of $7.0 \cdot 10^{18} cm^{-3}$, $CoAs_3$ samples possessed high P-type Hall mobilities, for instance, as high as 1429 $cm^2/Vs$ at a doping level of $3.1 \cdot 10^{18} cm^{-3}$. Also, $RhP_3$ samples possessed Hall mobilities, for instance, as high as 745 $cm^2/Vs$ at a doping level of $6.0 \cdot 10^{19} cm^{-3}$.

Semiconductor alloys and related solid solutions have also been prepared by low temperature powder sintering of for example, iridium, cobalt, rhodium and antimony in ratios close to stoichiometry (±2 atomic %). Completion of the reaction was achieved in times as short as six hours at a temperature of 600C. The resulting powders of $IrSb_3$ alloy and several compositions of the $(Ir_{1-x-y}Rh_xCo_y)Sb_3$ solid solutions were placed in a graphite die container and subjected to hot pressing of the alloy powders to form the desired polycrystalline pellets. The hot pressing was typically conducted for at least 30 minutes at a temperature of at least 650C.

These same elemental powders of iridium, cobalt, antimony and rhodium have also been successfully hot-pressed under specific conditions into large pellets (not shown). Several different mixtures of elemental powders were successfully hot-pressed in a graphite die (not shown) into dense polycrystalline pellets about 15 mm long and 6 mm in diameter. The resulting alloys demonstrated exceptional thermoelectric properties. Hot pressing was typically performed for six hours at 800C.

Doping of elemental and alloyed powders can be achieved by introducing the desired amount of dopant in the initial powder load. By using commercially available hot presses and graphite die containers, this process is quick, cost effective and may be easily adapted to industrial manufacturing of large quantities of $(Ir_{1-x-y}Rh_xCo_y)Sb_3$ samples of different compositions and doping level.

Figure 6:
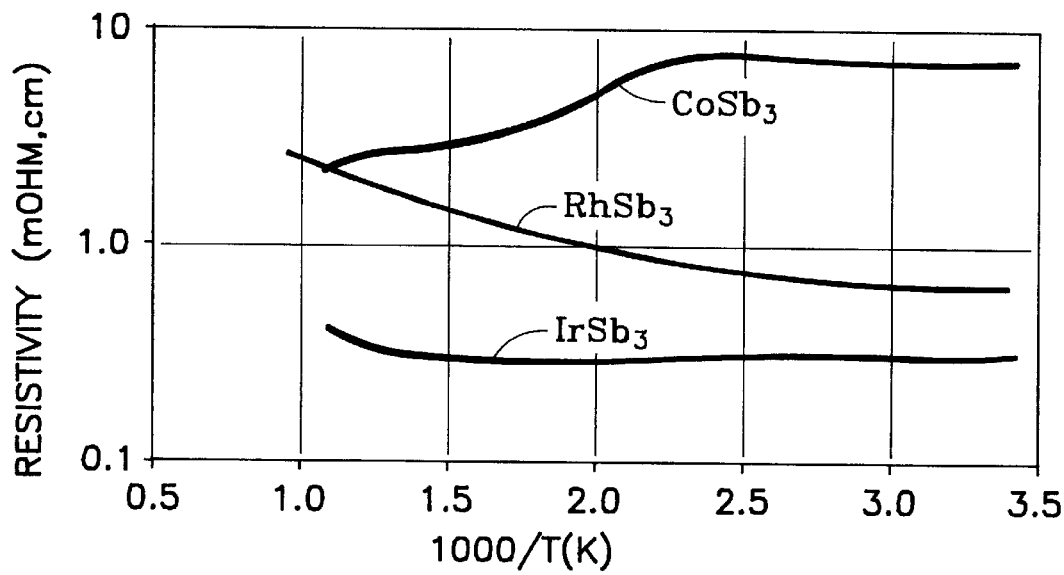
FIG. 6 is a graph showing typical electrical resistivity values as an inverse function of temperature associated with semiconductor alloys prepared in accordance with the present invention.

FIG. 6 is a graphical representation of typical electrical resistivity values as an inverse function of temperature for semiconductor alloys $CoSb_3$, $RhSb_3$, and $IrSb_3$ having skutterudite-type crystal lattice structure 40. All three compounds have typical semiconducting properties in the entire temperature range of typical semiconductor measurements. Although the P-type compounds of the present invention have moderately high carrier concentrations, the electrical resistivity, $\rho$ of the extrinsic P-type compounds is very low, ranging from 0.3 m$\Omega$cm to 1 m$\Omega$cm at room temperature. This low $\rho$ is due to exceptionally high Hall mobility values. In addition, no intrinsic action occurs for $RhSb_3$, and $IrSb_3$ at the higher temperatures.

Figure 7:
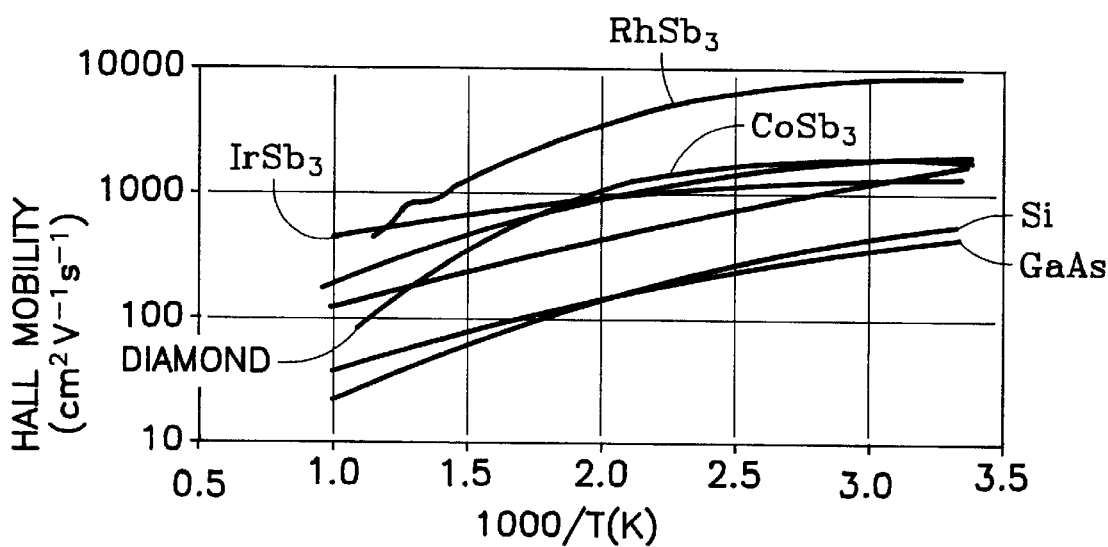
FIG. 7 is a graph showing typical Hall mobility values as an inverse function of temperature associated with semiconductor alloys prepared in accordance with the present invention as compared to other P-type semiconductor materials.

FIG. 7 is a graphical representation of typical Hall mobility values as a function of inverse temperatures for semiconductor alloys $CoSb_3$, $RhSb_3$, and $IrSb_3$ having skutterudite-type crystal lattice structure 40. The semiconductor alloys of the present invention are relatively heavily-doped P-type $CoSb_3$, $RhSb_3$, and $IrSb_3$ as compared to lightly doped P-type Si, GaAs, Ge and diamond. The hole mobility of $IrSb_3$ and $RhSb_3$ at 800C is excellent and is approximately 500 cm$^2$V$^{-1}$s$^{-1}$, or 20 times higher than that for lightly doped Si and GaAs.

Figure 8:
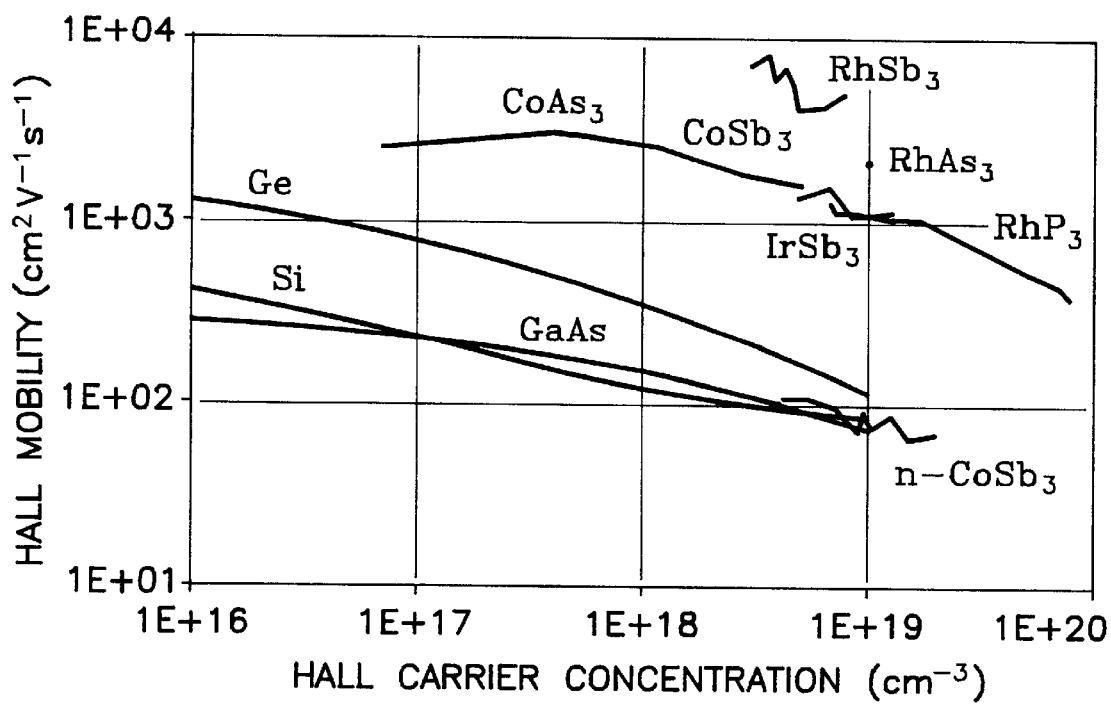
FIG. 8 is a graph showing Hall mobility values as a function of carrier concentration associated with semiconductor alloys prepared in accordance with the present invention as compared to other P-type semiconductor materials.

FIG. 8 illustrates room temperature Hall mobility values as a function of carrier concentration for P-type semiconductor alloys $CoSb_3$, $CoAs_3$, $RhSb_3$, $RhP_3$, $RhAs_3$, $IrSb_3$, and N-type $CoSb_3$. Mobility values for these semiconductor alloys are compared to mobility values for state of the art electronic P-type semiconductors Si, Ge, GaAs and Diamond. The semiconductor alloys or skutterudite compounds have Hall mobility values 1 to 2 orders of magnitude higher than that for Si and GaAs at similar carrier concentrations. The highest Hall mobility values are achieved for $RhSb_3$, for instance, up to 8000 cm$^2$V$^{-1}$s$^{-1}$ for a carrier concentration of 2.5×10$^{18}$ cm$^{-3}$, which is 4 times higher than P-type diamond (2000 cm$^{-2}$V$^{-1}$s$^{-1}$ for a carrier concentration of 1.0×10$^{14}$ cm$^{-3}$).

Figure 9:
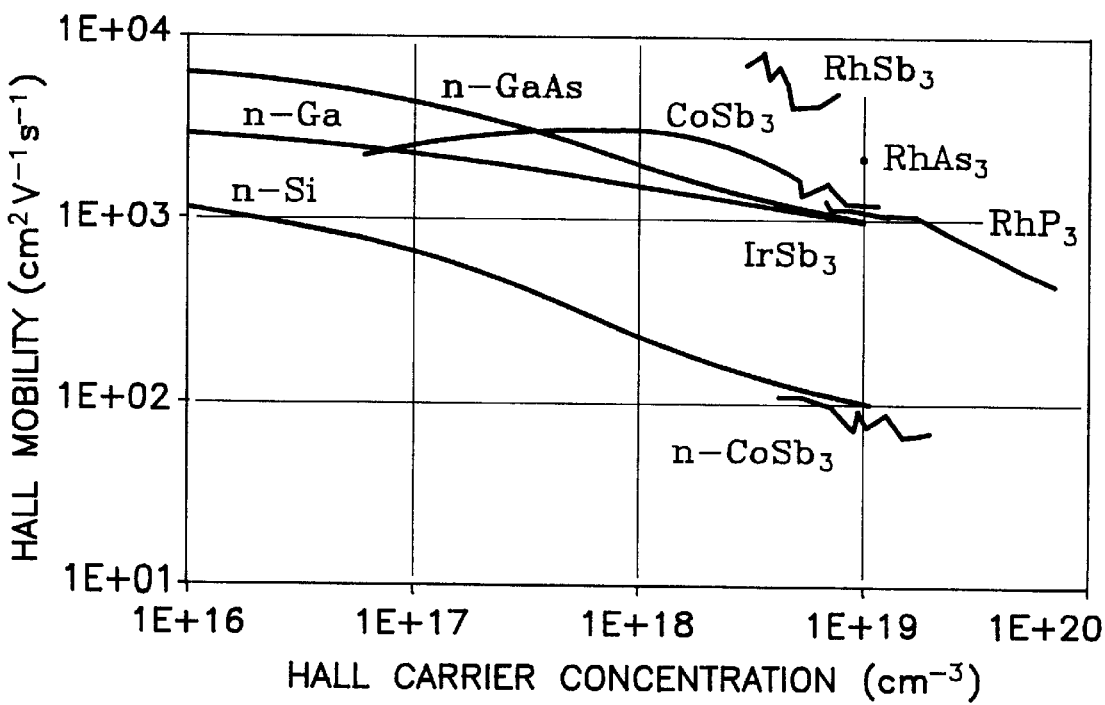
FIG. 9 is a graph showing Hall mobility values as a function of carrier concentration associated with semiconductor alloys prepared in accordance with the present invention as compared to other N-type semiconductor materials.

FIG. 9 illustrates room temperature Hall mobility values as a function of carrier concentration for P-type semiconductor alloys $CoSb_3$, $CoAs_3$, $RhSb_3$, $RhP_3$, $RhAs_3$, $IrSb_3$, and N-type $CoSb_3$. Mobility values for these compounds are compared to mobility values for state of the art electronic N-type semiconductors Si, Ge, GaAs and Diamond. The skutterudite compounds still have Hall mobility values orders of magnitude higher than that for Si and GaAs at similar carrier concentrations.

Figure 10:
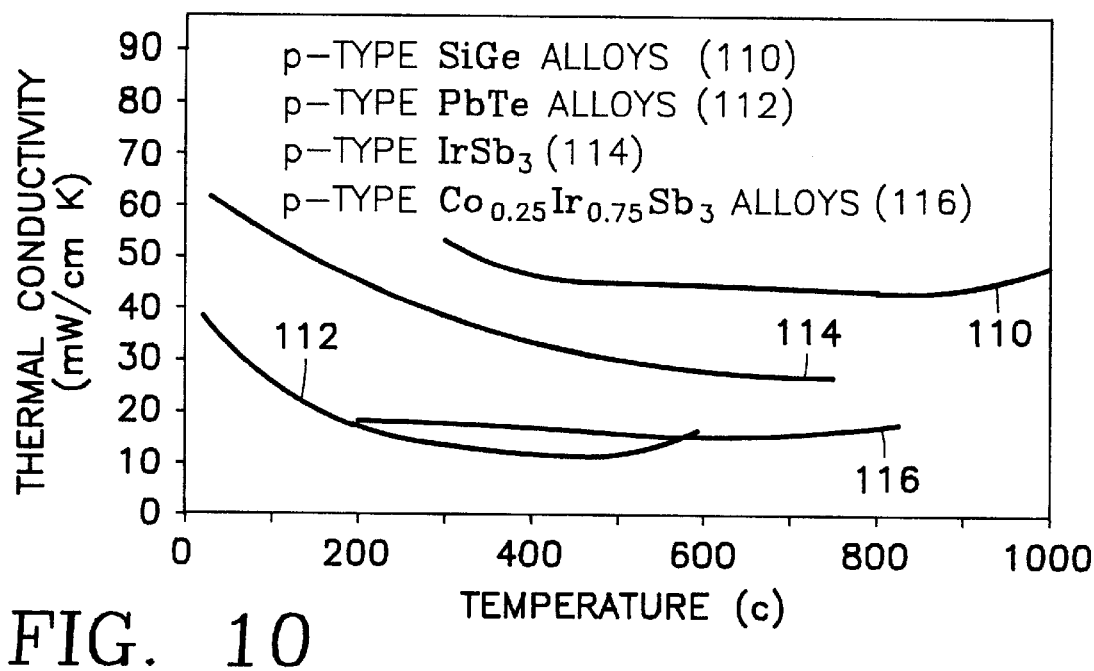
FIG. 10 is a graph showing thermal conductivity as a function of temperature for semiconductor alloys prepared in accordance with the present invention as compared with presently available semiconductor materials.

FIG. 10 is a graphical comparison of thermal conductivity as a function of temperature for semiconductor alloys $IrSb_3$ and $Co_{0.25}Ir_{0.75}Sb_3$ prepared in accordance with the present invention as compared with previously available semiconductor materials SiGe alloys and PbTe alloys. Curves 110 and 112 show thermal conductivity measured for SiGe alloys and PbTe based alloys respectively. Curves 114 and 116 are based on thermal conductivity measurements for semiconductor materials $IrSb_3$ and $Co_{0.25}Ir_{0.75}Sb_3$ respectively prepared in accordance with the present invention. The thermal conductivity of the semiconductor alloys of the present invention is low as compared to SiGe.

The complex skutterudite compositions of the present invention, including solid solutions and ternary compounds, have high carrier mobility. These semiconducting compounds have exceptionally high P-type carrier mobility values at high doping levels. Phosphides $CoP_3$, $RhP_3$, and $IrP_3$, and arsenides $CoAs_3$, $RhAs_3$, $IrAs_3$ are isostructural to $CoSb_3$, $RhSb_3$ and $IrSb_3$ antimonides. $CoSb_3$, $RhSb_3$ and $IrSb_3$ are of the same skutterudite crystallographic structure and form solid solutions of $Co_{1-x-y}Rh_xIr_ySb_3$ compositions.

Semiconductor alloys of $CoSb_3$, $RhSb_3$, $IrSb_3$, $CoP_3$, $RhP_3$, $IrP_3$, $CoAs_3$, $RhAs_3$, and $IrAs_3$ skutterudite-type crystal lattice structure 40 prepared in accordance with the present invention have demonstrated the characteristics shown in the following Table 1.

Figure 11:
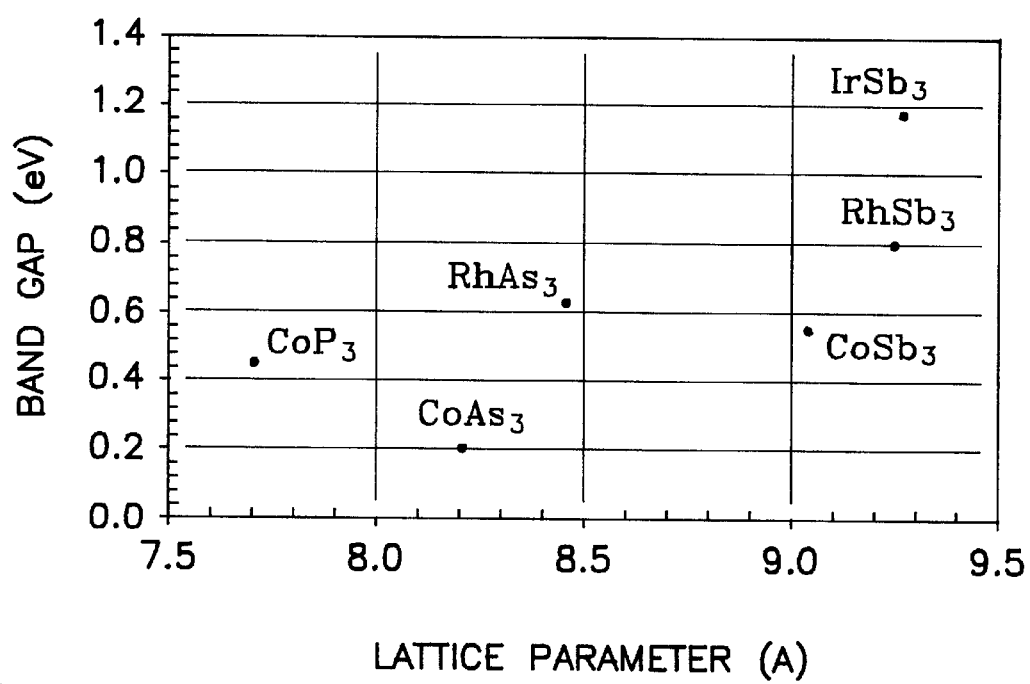
FIG. 11 is a graph showing lattice parameters and band gaps for the semiconductor alloys of the present invention.

FIG. 11 illustrates the lattice parameters and band gaps of $CoSb_3$, $RhSb_3$, $IrSb_3$, $CoP_3$, $CoAs_3$, and $RhAs_3$. The combination of high ranging lattice parameters (from 7.7073 Å for $CoP_3$, to 9.25338 Å for $IrSb_3$), wide bandgaps (0.21 eV for $CoAs_3$, to 1.2 eV for $IrSb_3$) and high ranging melting points (from 850C. for $CoSb_3$ to over 1200C. for $IrP_3$) are extremely desirable. In addition, more complex skutterudite compositions, including solid solutions and ternary compounds, have similar properties. Moreover, the compounds can be modified to conform to specific needs of a thin film electronic device (bandgap requirements) and can match a particular substrate (lattice parameter requirements). Corresponding properties for state of the art wide bandgap semiconductors used for electronic applications are also shown in Table 1.

Because the skutterudite compounds of the present invention are heavily-doped semiconductors, they can be used in high frequency electronic devices to produce high power and high speed. Materials for high power and high speed in high frequency devices are determined in terms of on-state resistance, power loss caused by junction leakage, heat conduction, radiation hardness, high frequency performance and high temperature operation. Several figures of merit related to the performance of a particular material at high temperature and high frequency are typically analyzed. These figures of merit are based on transport parameters of the particular material and include high peak electric field $E_M$, high carrier mobility $\mu$, high avalanche breakdown voltage $V_B$ for the same doping density $n_B$, and wide band gaps $E_g$.

Assuming an abrupt P-N junction on a uniformly doped material, the breakdown voltage $V_B$ can be calculated from the following expression:

$$V_B = \frac{\epsilon_S E_M^2}{2en_B}$$

where $\epsilon_S$ is the dielectric constant and e is the charge of the electron. The skutterudite compounds of the present invention have low $V_B$ values relative to their carrier concentrations $n_B$. Also, $E_M$ values for the skutterudites are similar to that of other semiconductors. Although skutterudite materials have high carrier concentrations, the skutterudites will have similar values as compared with other semiconductors since $E_M$ values are a slowly varying function of the background doping density for most semiconductors.

The drift region conductance per unit area $\sigma_A$, is determined by the following expression:

$$\sigma_A = \frac{\epsilon_S \mu E_M^3}{4 V_B}$$

Since the carrier mobility $\mu$ for the skutterudites is large and the $V_B$ for the skutterudites is relatively small, the electrical conductivity and the drift region conductance per unit area, $\sigma_A$ is large. A combination of high $n_B$ values and high $\mu$ values is unique to the skutterudites as compared with typical semiconductors.

From the above expressions, various figures of merit are calculated. One figure of merit is the Johnson figure of merit (JFM):

$$JFM = \frac{E_M^2 v_S^2}{4\pi^2}$$

where c is the velocity of light and $\lambda$ is the thermal conductivity. Estimated saturated carrier drift velocity values $v_S$, for the skutterudites are similar to that of other semiconductors (approximately $1.0 \times 10^7 cms^{-1}$). The JFM defines the power frequency product for a low voltage transistor. The Keyes figure of merit KFM:

$$KFM = \lambda \sqrt{\frac{cv_S}{4\pi\epsilon_r}}$$

provides a thermal limitation to the switching behavior of transistors used in integrated circuits.

High JFM and KFM values are desirable for a good power semiconductor switch. However, these two figures of merit (JFM and KFM) are not sufficient criteria because they do not account for all the optimum properties required for high power electronics.

In particular, the drift region conductance is an important factor. The drift region conductance must be maximized in order to increase the power-handling capability of a semiconductor device. The Baliga figure of merit BFM:

$$BFM = \epsilon_r \mu E_g^3$$

defines a particular material's parameters necessary to minimize the conduction losses in power field effect transistors (FET) and is related to the drift conductance. The BFM is based on assumptions that the power losses in a FET are only due to the power dissipation in the on-state by current flow through the on-resistance of the power FET.

However, this assumption is only valid at low frequencies of operation. In high frequency systems, it is necessary to include the switching losses due to the charging and discharging of the input capacitance during each cycle. Thus the adjusted Baliga figure of merit (BHFFM):

$$BHFFM = \frac{\mu E_M^2 \sqrt{V_G}}{2 V_B^{4.5}}$$

is for evaluating high frequency switching capability of electronic devices where $V_G$ is the gate drive voltage.

In addition to heat conduction problems, high temperature operation considerations include the effect of high temperatures on the device conductivity in the on-state. These high temperatures result from a decrease in carrier mobility and bandgap as well as the effect of intrinsic thermal leakage currents on power dissipation in the off-state. Thus, the temperature dependence of the drift conductance, or carrier mobility is an important factor.

Referring back to FIG. 7 mobility values of the skutterudites remain high even at high temperatures with a $T^{-1}$ type temperature dependence. Most other electronic wide band gap semiconductors actually have a stronger temperature dependence ($T^{-1.5}$ to $T^{-2}$). The temperature rise of a junction above its ambient temperature is proportional to the thermal resistance of the heat conduction medium (thermal conductivity). Thus, the total power dissipated in the system (Joule heat) is a good measure of the power handling capability (PHC) of an electronic device:

$$Q_F = \lambda \sigma_A$$

This expression assumes that the active semiconductor device with low thermal conductivity is actually bonded to a heat sinking substrate.

Typical values for the drift conductance $\sigma_A$, hole mobility $\mu$, and thermal conductivity $\lambda$, of binary skutterudite compounds of the present invention are compared with state of the art electronic materials in Table 1. The comparison is normalized to the values obtained for P-type Si. This comparison clearly shows that the hole mobility of the skutterudite compounds of the present invention is exceptional considering the much higher carrier concentrations. Consequently, the very large $\sigma_A$ values more than offset the low thermal conductivity values. Further, $\sigma_A$ calculations based on the higher mobility values achieved for n-type state of the art electronic materials predict excellent results. Therefore, the temperature rise of the junction over its ambient temperature will be negligible, minimizing heat dissipation problems. Also, the slow decrease of mobility with temperature increase allows the operation of skutterudite electronic devices at temperatures much higher than that possible from Si devices.

Table 1 illustrates PHC, BFM and BHFFM values of the skutterudites of the present invention as compared with state of the art semiconductors. Thus, these figures of merit demonstrate that the P-type skutterudites of the present invention (in particular $RhSb_3$ and $IrSb_3$) have superior transport properties for high power, high temperature, and high frequency electronic devices.

Figure 12:
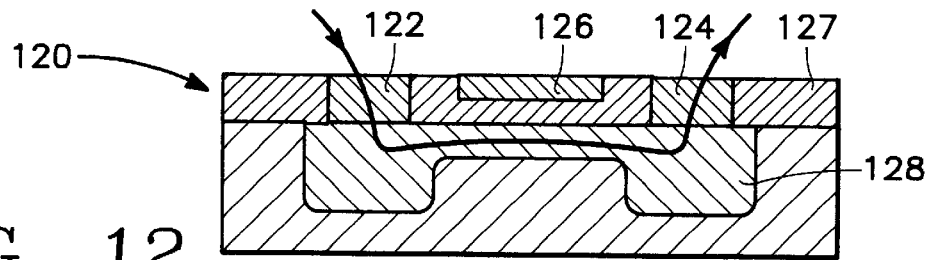
FIG. 12 is a FET device which may be fabricated from semiconductor alloys incorporating the present invention.

The following are example devices that can be fabricated with the skutterudites of the present invention. FIG. 12 illustrates a field-effect transistor (FET) 120. The FET 120 is a three terminal mechanism and can be comprised of P-type and N-type semiconductor alloys or skutterudites of the present invention. The FET 120 has input and output sections. The input and output sections can be used to switch and amplify electrical signals. The FETs 120 can be utilized independently or in conjunction with thousands of other FETs 120 as the basic components of an integrated circuit on the skutterudite chip. The FET 120 includes a source 122 or input terminal, a drain 124 or output terminal, and a gate 126 or terminal common to the input and output terminals. The FET 120 also has an oxidized portion 127 of a semiconductor alloy of the present invention.

In addition, the FET 120 has a channel 128 which is the conducting path between the drain and source terminals through which the current flows. The channel 128 is a doped portion of a semiconductor alloy of the present invention. Two types of FETs 120 can be fabricated from the semiconductor alloys of the present invention, the P-channel FET and the N-channel FET. The primary difference in operation between the two types of FETs 120 is the polarity of the source voltage and the type of current carrier in the channel.

A metal-oxide semiconductor field-effect transistor (MOSFET) is a type of FET 120 that can be fabricated with the semiconductor alloys of the present invention as either a P-channel or N-channel MOSFET. The input terminal 122 of the MOSFET has a built-in capacitor, and the input voltage across the capacitor controls the output current. Increasing the gate 126 voltage increases the current flow. The gate terminal 126 of the MOSFET is insulated from each channel by a very thin oxidized layer of a semiconductor alloy of the present invention. In addition to the source 122, the drain 124 and the gate 126, the MOSFET has a fourth element, designated as the body, or substrate. The body or substrate can be either connected internally or as an external terminal.

Figure 13:
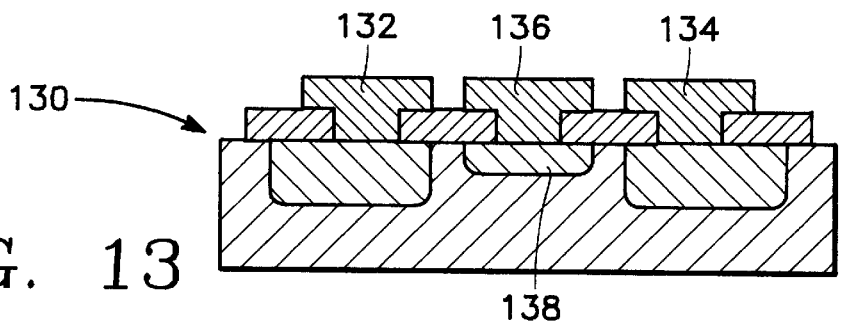
FIG. 13 is a JFET device which may be fabricated from semiconductor alloys incorporating the present invention.

FIG. 13 illustrates a junction field-effect transistor (JFET) 130. The JFET 130 is a type of FET 120 and also can be fabricated with semiconductor alloys of the present invention as either an N-channel or P-channel JFET. The JFET 130 is fabricated similar to that of the MOSFET and has a source 132, drain 134, and a gate 136. However, the JFET 130 has a junction 138 formed under the gate 134. When the JFET 130 is in operation, the current flows under the junction 138 (diffused region), from the source 132 to the drain 134.

Figure 14:
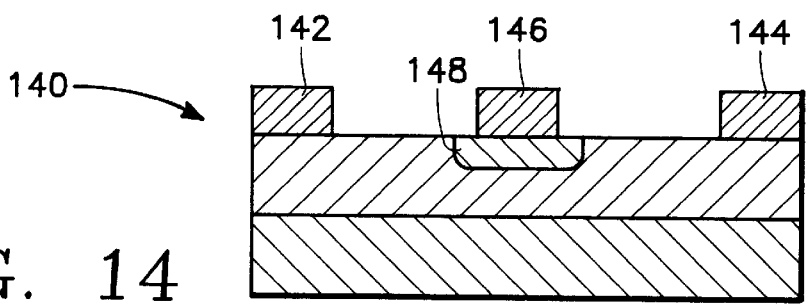
FIG. 14 is a MESFET device which may be fabricated from semiconductor alloys incorporating the present invention.

FIG. 14 illustrates the metal semiconductor field-effect transistor (MESEFET) 140. The MESFET 140 is similar to the JFET 130 and has a source 142, a drain 144, and a gate 146. However, the gate metal 146 is deposited directly onto the N-type semiconductor alloy material 148 of the present invention.

The operating characteristics of the FET family include low powered dissipation, low voltage requirements, and smaller size. The FET family has an extremely low input resistance thus, producing no loading effect and reducing components required. In addition, FETs produce less electrical noise, use less power, and require less cooling.

Figure 15:
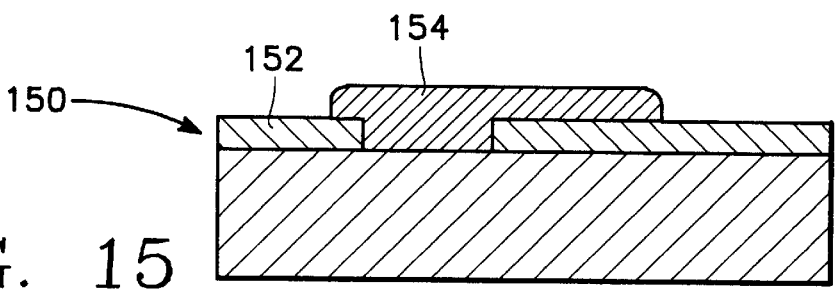
FIG. 15 is a schottky diode device which may be fabricated from semiconductor alloys incorporating the present invention.

FIG. 15 illustrates a shottky diode. The schottky diode 150 is a two terminal device comprised of an N-type doped semiconductor alloy or skutterudite 152 of the present invention and a metallic material 154, such as, silver, gold, chrome, or platinum. Electrons are the major current carriers in the materials of the Shottky diode. When the two materials are connected during the formation process, electrons from the N-type semiconductor alloy or skutterudite 152 flow into the adjoining metal 154. Conduction is created entirely by the majority carriers. The massive flow of electrons from the N-type semiconductor alloy material 152 of the present invention to the metal causes a depletion of current carriers near the semiconductor alloy-metal junction.

The schottky diode 150 utilizing the semiconductor alloy material is a high-speed switching device because the minority current carriers are absent or nearly absent and reduce the reverse recovery time of a solid state device. Thus, since minority carriers are minimized, the shottky diode 150 of the present invention can be used to change states very quickly.

Figure 16:
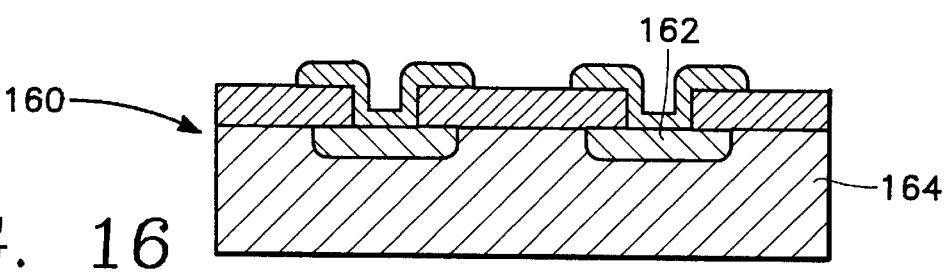
FIG. 16 is a heterojunction device which may be fabricated from semiconductor alloys incorporating the present invention.

FIG. 16 is a heterojunction device 160 which may be fabricated from semiconductor alloys of the present invention. A PN junction is the section between two adjacent diffused P 162 and N 164 regions respectfully. As shown in FIG. 9 and Table 1, at high carrier concentrations, mobility values for N-type $CoSb_3$ are comparable to mobility values for N-type Si, P-type Si and P-type GaAs. Therefore, PN junctions 160 with superior electronic characteristics can be obtained by using $CoSb_3$ and other semiconductor alloys of the present invention.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A semiconductor device comprising a first material having a skutterudite-type crystal lattice structure with a unit cell of eight groups of $AB_3$ wherein A comprises a metal atom and B comprises a non-metal atom.

2. The semiconductor device as defined in claim 1 wherein the first material comprises $IrSb_3$.

3. The semiconductor device as defined in claim 1 wherein the first material comprises $IrP_3$.

4. The semiconductor device as defined in claim 1 wherein the first material comprises $IrAs_3$.

5. The semiconductor device as defined in claim 1 wherein the first material comprises $CoSb_3$.

6. The semiconductor device as defined in claim 1 wherein the first material comprises $CoP_3$.

7. The semiconductor device as defined in claim 1 wherein the first material comprises $CoAs_3$.

8. The semiconductor device as defined in claim 1 wherein the first material comprises $RhSb_3$.

9. The semiconductor device as defined in claim 1 wherein the first material comprises $RhP_3$.

10. The semiconductor device as defined in claim 1 wherein the first material comprises $RhAs_3$.

11. The semiconductor device as defined in claim 1 wherein the first material comprises a semiconductor alloy having the formula:

$$Co_{1-x-y}Rh_xIr_ySb_3$$

wherein $0 \leq x \leq 1$ and $0 \leq y \leq 1$.

12. The semiconductor device as defined in claim 1 wherein the first material comprises a semiconductor alloy having the formula:

$$Co_{1-x-y}Rh_xIr_yP_3$$

wherein $0 \leq x \leq 1$ and $0 \leq y \leq 1$.

13. The semiconductor device as defined in claim 1 wherein the first material comprises a semiconductor alloy having the formula:

$$Co_{1-x-y}Rh_xIr_yAs_3$$

wherein $0 \leq x \leq 1$ and $0 \leq y \leq 1$.

14. The semiconductor device as defined in claim 1 further comprising a second material selected from the group consisting of Bi-Sb alloys, $Bi_2Te^3$ based alloys, PbTe based alloys, $\beta$-$FeSi_2$ based alloys, $Ga_{1-x}In_xSb$ based alloys, and SiGe alloys.

15. A semiconductor device comprising a first material having the formula:

$$Co_{1-x-y}Rh_xIr_ySb_3$$

wherein $0 \leq x \leq 1$ and $0 \leq y \leq 1$.

16. The semiconductor device as defined in claim 15, wherein the first material has the formula:

$Co_{1-x-y}Rh_xIr_yP_3$ wherein $0 \leq x \leq 1$ and $0 \leq y \leq 1$.

17. The semiconductor device as defined in claim 15, wherein the first material has the formula:

$Co_{1-x-y}Rh_xIr_yAs_3$ wherein $0 \leq x \leq 1$ and $0 \leq y \leq 1$.

18. The semiconductor device as defined in claim 15 wherein the first material further comprises a skutterudite-type crystal lattice structure.

19. The semiconductor device as defined in claim 15 further comprising a second material selected from the group consisting of Bi-Sb alloys, $Bi_2Te_3$ based alloys, PbTe based alloys, $\beta$-$FeSi_2$ based alloys, $Ga_{1-x}In_x$Sb based alloys, and SiGe alloys.

20. A semiconductor device having a plurality of semiconductor elements formed from at least two different types of semiconductor materials comprising:

a first portion of the semiconductor elements formed from P-type semiconductor material having a skutterudite type crystal lattice structure; and the P-type semiconductor material having the formula:

$Co_{1-x-y}Rh_xIr_ySb_3$ wherein $0 \leq x \leq 1$ and $0 \leq y \leq 1$.

21. The semiconductor device as defined in claim 20 wherein the P-type semiconductor material has the formula:

$Co_{1-x-y}Rh_xIr_yP_3$ wherein $0 \leq x \leq 1$ and $0 \leq y \leq 1$.

22. The semiconductor device as defined in claim 20 wherein the P-type semiconductor material has the formula:

$Co_{1-x-y}Rh_xIr_yAs_3$ wherein $0 \leq x \leq 1$ and $0 \leq y \leq 1$.

23. The semiconductor device as defined in claim 20 further comprising a second portion of the semiconductor elements formed from N-type semiconductor material selected from the group consisting of Bi-Sb alloys, $Bi_2Te_3$ based alloys, PbTe based alloys, $\beta$-$FeSi_2$ based alloys, $Ga_{1-x}In_x$Sb based alloys, and SiGe alloys.

24. A semiconductor generator having a general purpose heat source and a cooling assembly with a semiconductor device disposed therebetween comprising:

a plurality of semiconductor elements formed from at least two different types of semiconductor materials comprising:

a portion of the semiconductor elements formed from a P-type semiconductor material having a skutterudite-type crystal lattice structure; and the P-type semiconductor material having the formula:

$Co_{1-x-y}Rh_xIr_ySb_3$ wherein $0 \leq x \leq 1$ and $0 \leq y \leq 1$.

25. The apparatus as defined in claim 24 wherein the P-type semiconductor material has the formula:

$Co_{1-x-y}Rh_xIr_yP_3$ wherein $0 \leq x \leq 1$ and $0 \leq y \leq 1$.

26. The apparatus as defined in claim 24 wherein the P-type semiconductor material has the formula:

$Co_{1-x-y}Rh_xIr_yAs_3$ wherein $0 \leq x \leq 1$ and $0 \leq y \leq 1$.

27. The semiconductor generator as defined in claim 68 further comprising another portion of the semiconductor elements formed from an N-type semiconductor material selected from the group consisting Of alloys of Bi-Sb alloys, $Bi_2Te^3$ based alloys, PbTe based alloys, $\beta$-$FeSi_2$ based alloys, $Ga_{1-x}In_x$Sb based alloys, and SiGe alloys.

* * * * *